(12) United States Patent
Sakaiya et al.

(10) Patent No.: US 6,522,541 B2
(45) Date of Patent: Feb. 18, 2003

(54) ELECTRONIC APPARATUS AND ELECTRONIC EQUIPMENT USED THEREFOR

(75) Inventors: Hiroyuki Sakaiya, Tokyo (JP); Kunihiko Kaga, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/011,755

(22) Filed: Dec. 11, 2001

(65) Prior Publication Data

US 2002/0186534 A1 Dec. 12, 2002

(30) Foreign Application Priority Data

Jun. 12, 2001 (JP) .......................................... 2001-176791

(51) Int. Cl.[7] .................................................. H05K 7/20
(52) U.S. Cl. ........................ 361/697; 361/689; 361/690; 361/694; 361/695; 174/16.1; 174/16.3; 165/80.3; 454/184
(58) Field of Search .................................. 361/687–690, 361/694–697, 715, 719–721; 174/16.1, 16.3; 165/80.2, 80.3, 104.33, 185; 454/184

(56) References Cited

U.S. PATENT DOCUMENTS 4,296,455 A * 10/1981 Leaycraft et al. ............ 361/691
6,349,031 B1 * 2/2002 Lin et al. ..................... 361/685
6,349,042 B1 * 2/2002 Mills et al. .................. 361/818

* cited by examiner

*Primary Examiner*—Boris Chervinsky
(74) *Attorney, Agent, or Firm*—Oblon, Spivak, McClelland, Maier & Neustadt, P.C.

(57) ABSTRACT

An electronic apparatus receiving therein a plurality of electronic equipments, each of which has heat generating electronic parts and which are spaced from one another, has caused a problem that amounts of an air flowing into wind paths between the respective electronic equipments involve scatter.

To solve the above-mentioned problem, the electronic apparatus is constructed such that the pressure-loss adjusting plates 12 are provided on the fins 5 facing those wind paths of large inflowing air volume among the wind paths formed between the respective electronic equipments 2 received in the rack 1.

4 Claims, 9 Drawing Sheets

ELECTRONIC APPARATUS AND ELECTRONIC EQUIPMENT USED THEREFOR

TECHNICAL FIELD

The invention relates to an electronic apparatus having a plurality of electronic equipments contained in a rack, which electronic equipments have electronic parts each making a heat source, and to an electronic equipment.

BACKGROUND ART

FIG. 8 is a plan view showing the construction of conventional electronic equipment. In FIG. 8, the reference numeral 1 denotes a rack, 2 electronic equipments, 3 a fan, 4 electronic parts constituting heat sources, 5 fins for radiating heat from the electronic parts 4, 6 covers which cover the electronic parts 4, and 17 is an electronic apparatus comprising these elements. Also, FIG. 9 is a cross sectional view taken along the line A–A' of the electronic equipment 2. In FIG. 9, the reference numeral 7 denotes a chassis, 8 a package, 9 an inner casing, 10 fin-inbetween wind paths, and 11 a bypass wind path. In addition, in FIG. 9, the same reference numerals as those in FIG. 8 denote the same or corresponding parts, and so an explanation thereof is omitted.

An explanation will be given below to the constitution. As shown in FIG. 8, a plurality of electronic equipments 2 are arranged in the rack 1 such that the fins 5 and covers 6 face each other. Provided between adjacent electronic equipments 2 is a clearance (gap), which facilitates mounting of the electronic equipments 2 and work for maintenance and replacement. Mounted on these electronic equipments 2 are electronic parts 4, from which heat generates during action. The fins 5 extending from an upstream side, where an air inflows, to a downstream side are arranged in plural on a back surface of the chassis 7, on which the electronic parts 4 are mounted. Conventionally, die casting is used to form the fins 5 integral with the chassis 7. Die casting is a method of forming, in which a casting die is manufactured and a molten metal such as aluminum alloy or the like is injected into the casting die.

The fin-inbetween wind paths 10(FIG. 9) are passages of an air flowing between adjacent fins 5. And the bypass wind path 11 is a passage of an air not flowing into the fin-inbetween wind paths 10. The bypass wind path 11 means a clearance between adjacent electronic equipments 2, that is, a passage of an air flowing between the fins 5 and the cover 6 of predetermined electronic equipments 2, and also means a passage of an air flowing between the fins 5 and inner walls of the rack 1. The rack 1 is provided with the fan 3, which supplies an air to an interior of the rack 1. In addition, the fins 5 and the chassis 7, which have been integrally formed, in combination is called a heat sink.

An explanation will be given below to the action. The electronic parts 4 mounted in the respective electronic equipments 2 generate heat during action. The electronic parts 4 reach a temperature of about 100° C., and 140° C. or higher when high. Heat generated from the electronic parts 4 is transmitted to the package 8, inner casing 9, chassis 7, and the fins 5 shown in FIG. 9. Meanwhile, the fan 3 supplies an air to the interior of the rack 1 to create flows of wind passing through the fin-inbetween wind paths 10 and the bypass wind path 11. Heat transmitted to the fins 5, of heat generated from the electronic parts 4 is finally dispersed by wind flowing through the fin-inbetween wind paths 10. In this manner, since heat generated from the electronic parts 4 is mainly dispersed by wind flowing through the fin-inbetween wind paths 10, working of heat in the electronic parts 4 is suppressed.

With the electronic apparatus described above, the plurality of electronic equipments 2 are contained in the rack 1 with predetermined gaps between adjacent electronic equipments 2, as the result of taking account of workability in mounting, maintenance and replacement. In such electronic apparatus, a part of an air supplied from the fan 3 flows into the bypass wind path 11 and the remainder of the air flows into the fin-inbetween wind paths 10. In order to enhance the heat radiation efficiency of the electronic equipments 2, it is sufficient to increase an amount of an air flowing into the fin-inbetween wind paths 10 and to decrease an amount of an air flowing into the bypass wind path 11. FIG. 10 is a graph showing a ratio of air volumes flowing through fin-inbetween wind paths and a bypass wind path, and an illustration thereof. As shown in FIG. 10A, a bypass air volume (B) flowing into the bypass wind path 11 amounts to 35% of a total air volume, which is a total amount of an air supplied by the fan 3. FIG. 10B shows a manner, in which an air flows into the fin-inbetween wind paths and the bypass wind path. A ratio of a fin-inbetween air volume and a bypass air volume in the total air volume is determined by balancing of wind-path resistances in the fin-inbetween wind paths and the bypass wind path.

Hereupon, in the case where four electronic equipments 2 are mounted within the rack 1 as in the electronic apparatus shown in FIG. 8, four sets of the fin-inbetween wind paths and the bypass wind path are naturally defined. The fin-inbetween wind paths and the bypass wind path are described below as "wind paths". It has been revealed that an air taken into the rack 1 by the fan 3 does not flow evenly into the four wind paths but air volumes flowing into the respective wind paths scatter 20% at the maximum. Since air volumes flowing into the respective wind paths are uneven, the respective electronic equipments 2 scatter in heat radiation efficiency. That is, there is possibly caused the situation that among the electronic equipments mounted within the rack 1, those electronic equipments, for which a large amount of air flows into the wind paths, efficiently radiate heat but those electronic equipments, for which a small amount of air flows into the wind paths, do not act normally due to overheat. The reason why air volumes flowing into the respective wind paths scatter is believed to be due to scatter in wind-path resistance (pressure loss) for the respective wind paths, wind speed distribution within the rack 1, positions where the electronic equipments 2 are mounted, and the like.

In order to permit the respective electronic equipments 2 within the rack 1 to evenly radiate heat, it is necessary to suppress scatter in air volumes flowing into the four wind paths. In order to suppress scatter in air volumes flowing into the respective wind paths, measures have been conventionally adopted, in which a spacing between adjacent fins 5, that is, fin pitch is modified to adjust pressure loss (wind-path resistance) in fin-inbetween wind paths. When pressure loss is adjusted by modification of fin pitch, however, there is caused a problem that the electronic equipments 2 are lowered in heat radiation efficiency since balancing of pressure loss between the fin-inbetween wind paths and the bypass wind path is lost to permit an air flowing into the fin-inbetween wind paths to pass through the bypass wind path. Also, it is difficult to manufacture a heat sink of small fin pitch with the use of die casting. The reason for this is that resistance encountered when a molten metal is poured into tip ends of a casting die increases as the fin pitch becomes narrow and so high pressures must be applied when a molten metal is poured into the casting die. Also, since an area, at which the molten metal contacts with inner surfaces of the casting die, increases, the molten metal frequently solidifies before it reaches tip ends of the casting die, and so it is difficult to obtain a fin configuration in accordance with a design.

BRIEF SUMMARY OF THE INVENTION

The invention has been accomplished to solve the above-mentioned problems and has its object to eliminate scatter in air volumes flowing into a plurality of wind paths formed between a plurality of electronic equipments contained in a rack of an electronic apparatus.

An electronic apparatus according to the invention comprises an electronic equipment or equipments having a plurality of fins arranged to extend from an upstream side, where an air inflows, to a downstream side, a chassis permitting heat of heat generating electronic parts to be radiated through the fins, and a cover which covers the heat generating electronic parts; a rack containing therein a plurality of the electronic equipments, on which the fins of and the cover of adjacent electronic equipments face each other with a predetermined distance therebetween, the rack being formed with a plurality of wind paths, which are composed of fin-inbetween wind paths being passages of an air flowing between the fins, and bypass wind paths being passages of an air flowing between the fins of and the cover of adjacent electronic equipments; a fan for supplying an air into the rack and creating air flows passing through a plurality of wind paths formed within the rack; and pressure-loss adjusting members mounted on downstream sides of predetermined wind paths, in which an amount of inflowing air is relatively much, among the plurality of wind paths, to make a downstream-side cross sectional area of the predetermined wind paths smaller than a upstream-side cross sectional area thereof, thereby increasing pressure loss of the predetermined wind paths.

An electronic equipment, according to the invention, is arranged in plural within a predetermined housing to be spaced a predetermined distance from one another, each mounting thereon heat generating electronic parts generating heat, which is radiated by an air supplied into the housing, and the electronic equipment comprises a chassis, on which a plurality of fins are formed on an opposite side to a surface, on which the heat generating electronic parts are mounted, to extend from an upstream side, where an air inflows, to a downstream side, the chassis permitting an air flowing between the fins to radiate heat from the heat generating electronic parts, and a pressure-loss adjusting member formed to cover downstream-side end surfaces of the fins such that a wind path composed of fin-inbetween wind paths, which are passages of an air flowing between the fins, and a bypass wind path, which is a passage of an air flowing between adjacent electronic equipments, has a downstream-side cross sectional area larger than a upstream-side cross sectional area thereof.

DETAILED DESCRIPTION OF THE INVENTION

Figure 1:
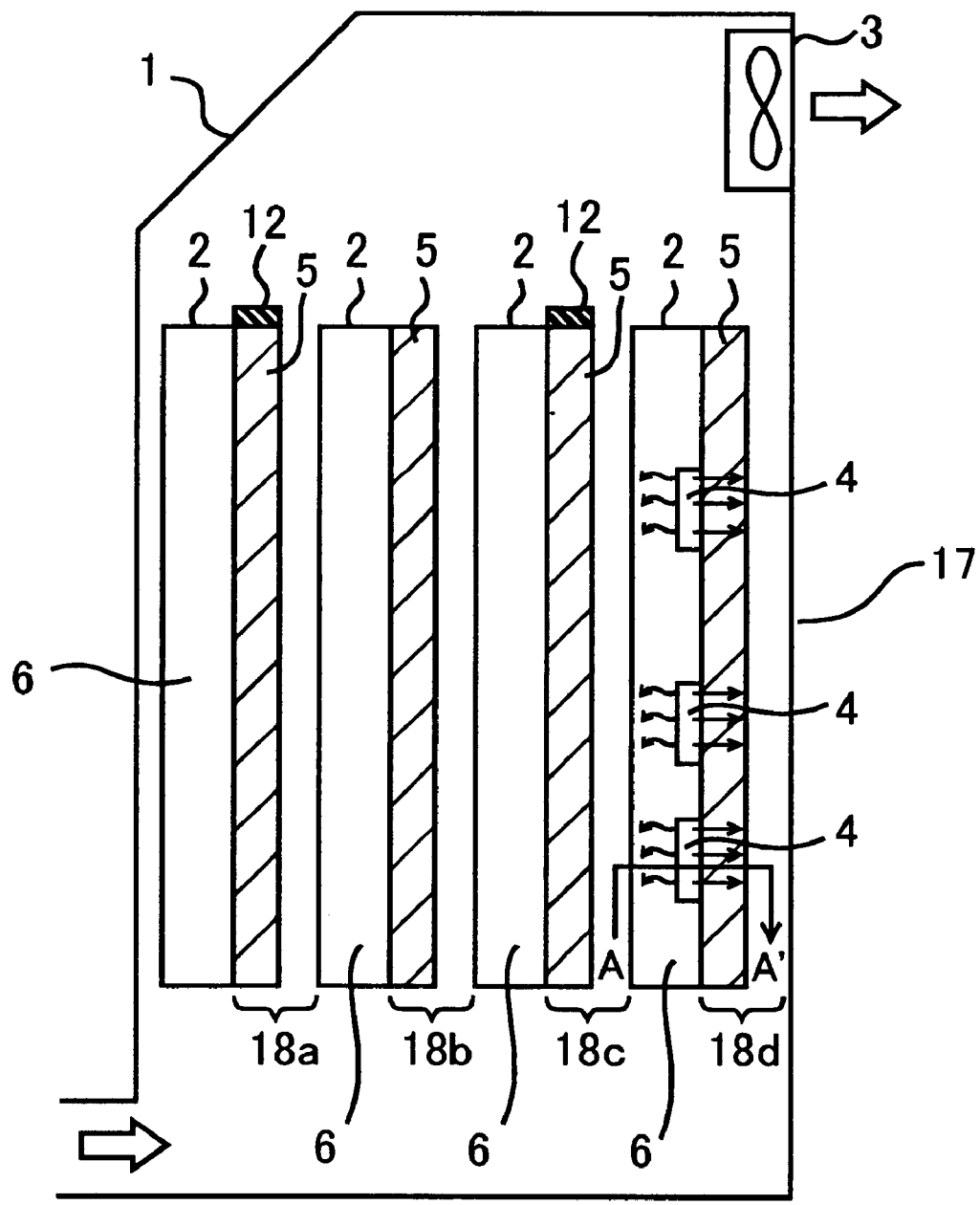
FIG. 1 is a plan view showing a construction of an electronic apparatus according to an embodiment of the invention.
Figure 8:
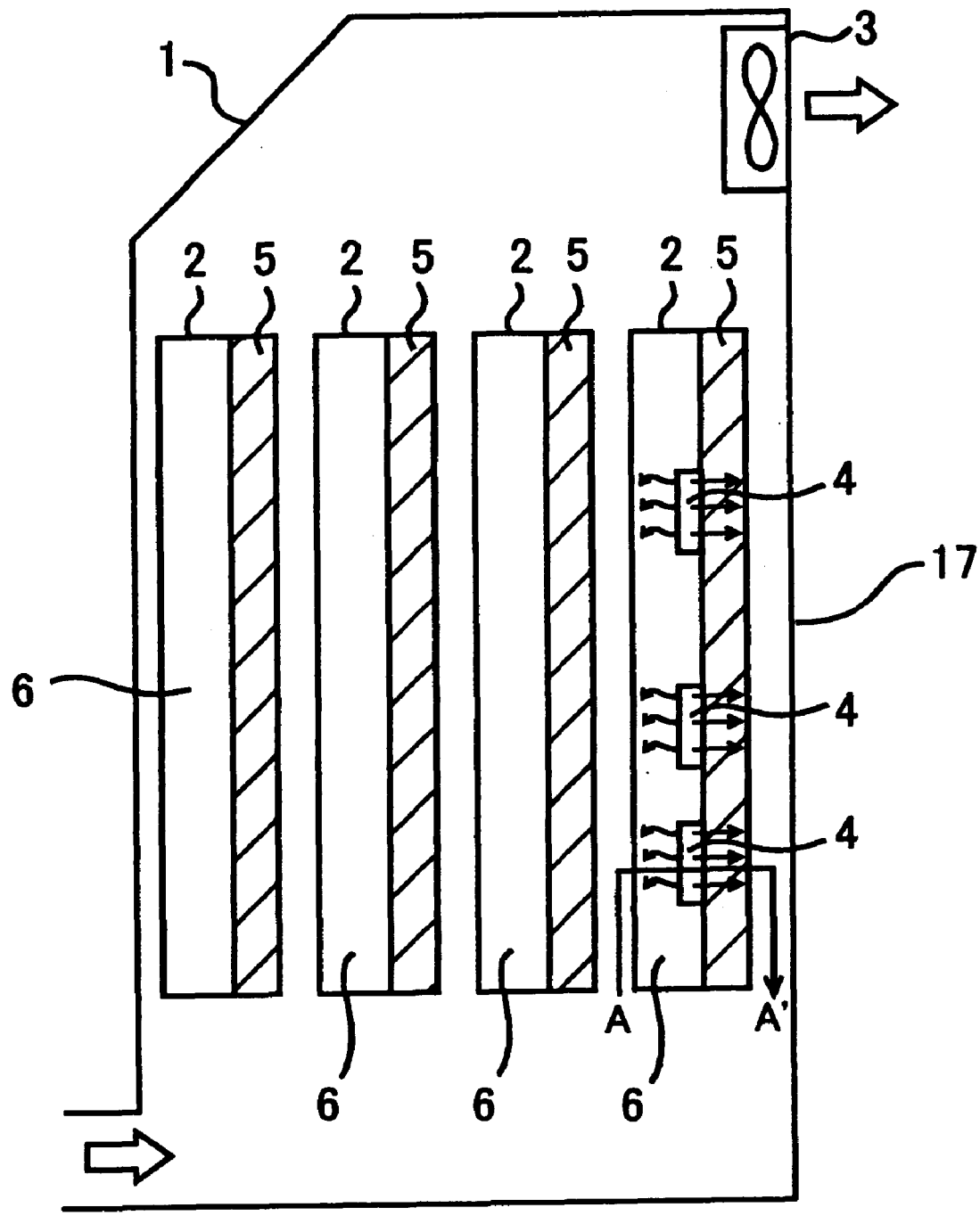
FIG. 8 is a plan view showing the construction of a conventional electronic equipment.
Figure 9:
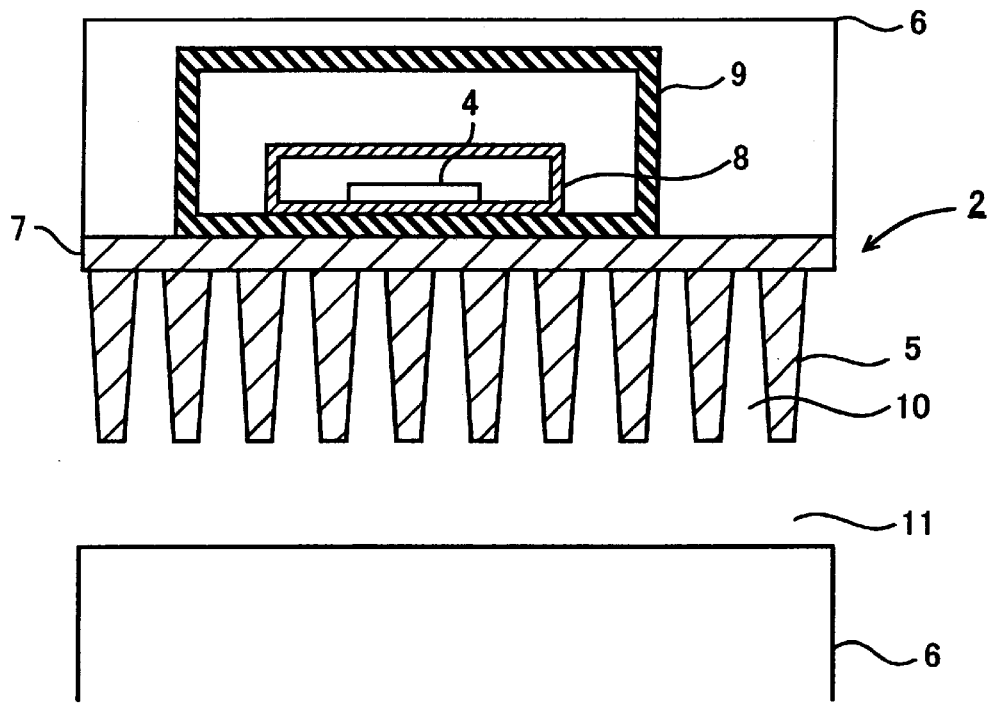
FIG. 9 is a cross sectional view showing the electronic equipment.
Figure 10A:
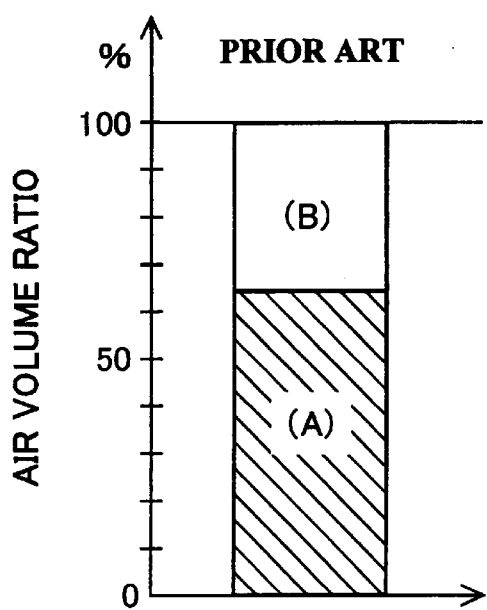
FIG. 10 is a graph showing a ratio of air volumes flowing through fin-inbetween wind paths and a bypass wind path, and an illustration thereof.
Figure 10B:
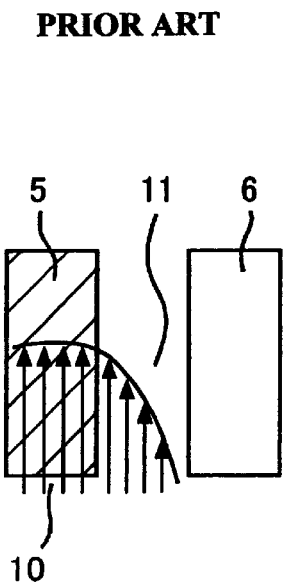

FIG. 1 is a plan view showing a construction of an electronic apparatus employing a radiating device for heat generating electronic parts, according to an embodiment of the invention. In FIG. 1, the reference numeral 12 denotes pressure-loss adjusting plates being pressure-loss adjusting members. The pressure-loss adjusting plates 12 extend in a width direction of fins 5 and comprise rectangular-shaped plates provided on side end surfaces downstream of the fins 5. The reference numerals 18a–18d denote air paths. The air paths 18a–18d each comprise an air path between fins and a bypass air path. Arrows in the figure indicate air flows entering into the air paths. Sides of the fins 5 where an air flows into the air paths are referred to as "upstream sides", and sides of the fins 5 where an air inflowing from the upstream sides passes through the air paths to be discharged are referred to as "downstream sides". In addition, in FIG. 1, the same reference numerals as those in FIG. 8 denote the same or corresponding parts, and so an explanation thereof is omitted.

Figure 2A:
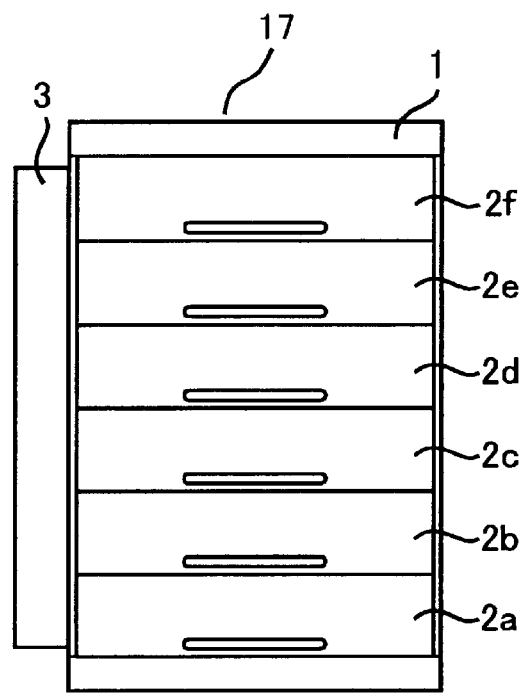
FIG. 2 is a front view showing an external appearance of a rack and a cross sectional view showing the same.
Figure 2B:
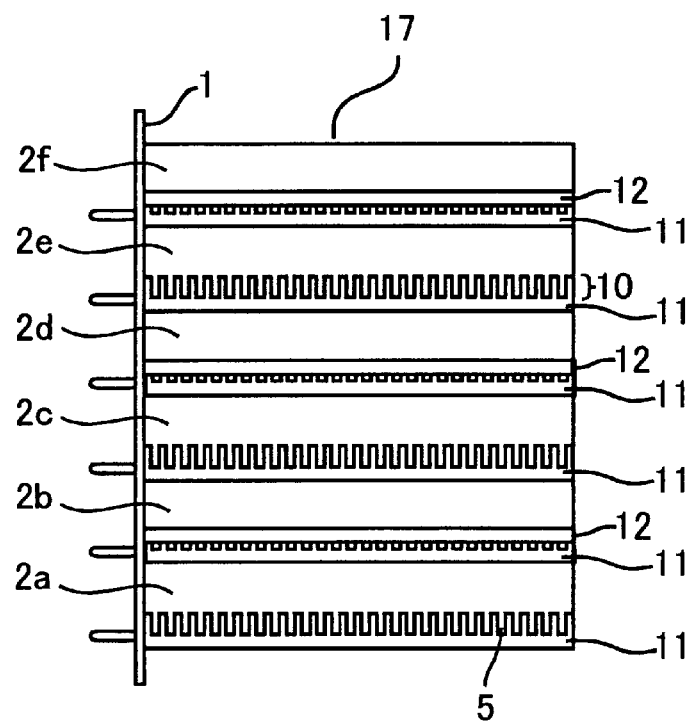
Figure 3A:
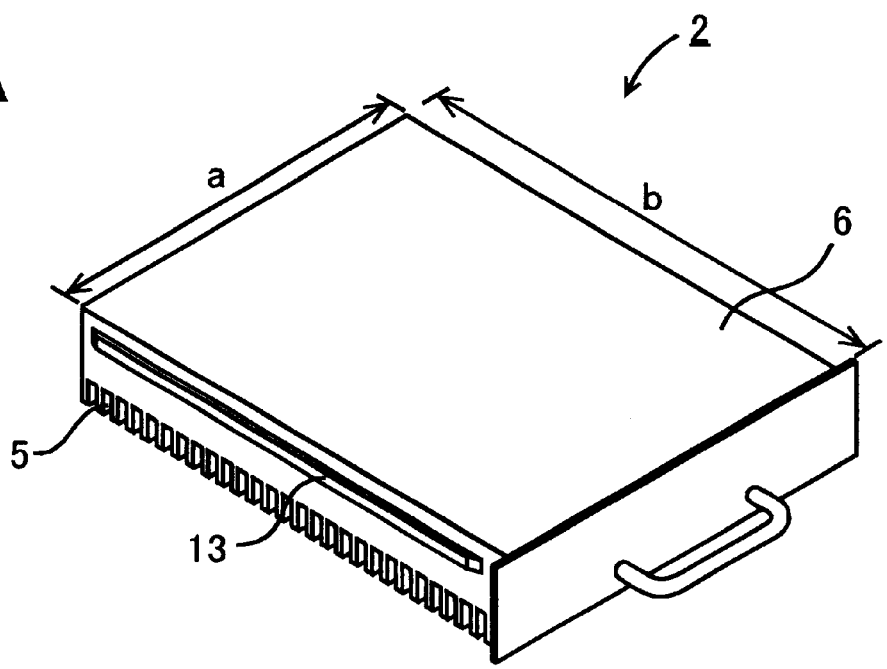
FIG. 3 is perspective views showing external appearances of an electronic equipment from sides of a cover and fins.
Figure 3B:
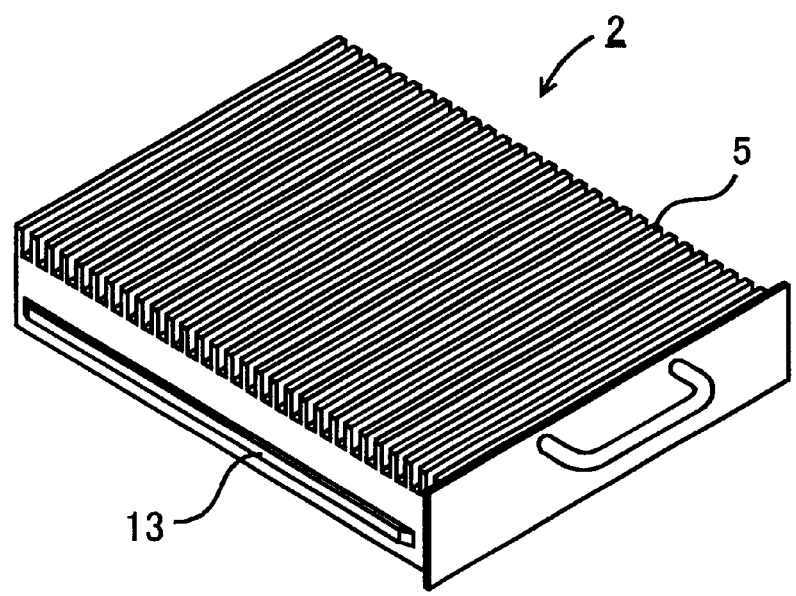

FIG. 2 is a front view showing an external appearance and a cross sectional view showing the same. As shown in FIG. 2A, a plurality of electronic equipments 2 are vertically stacked and received in a rack 1. And, as shown in FIG. 2B, the fins 5 and covers 6 of the electronic equipments 2 are arranged to face each other. In FIG. 2, the electronic equipments 2 stacked vertically and received in the rack 1 are designated by 2a, 2b, 2c, 2d, 2e and 2f in upward order. The pressure-loss adjusting plates 12 are provided on the electronic equipments 2b, 2d, 2f but not on the electronic equipments 2a, 2c, 2d, 2e. FIG. 3 is perspective views showing external appearances of the electronic equipment 2 from sides of the cover 6(FIG. 3A) and the fins 5(FIG. 3B), and showing the electronic equipment 2 with the pressure-loss adjusting plate 12 removed. In FIG. 3, the reference numeral 13 denotes rails. The rack 1 holds the rails 13 of the electronic equipments 2 to receive the electronic equipments 2 therein.

Figure 4A:
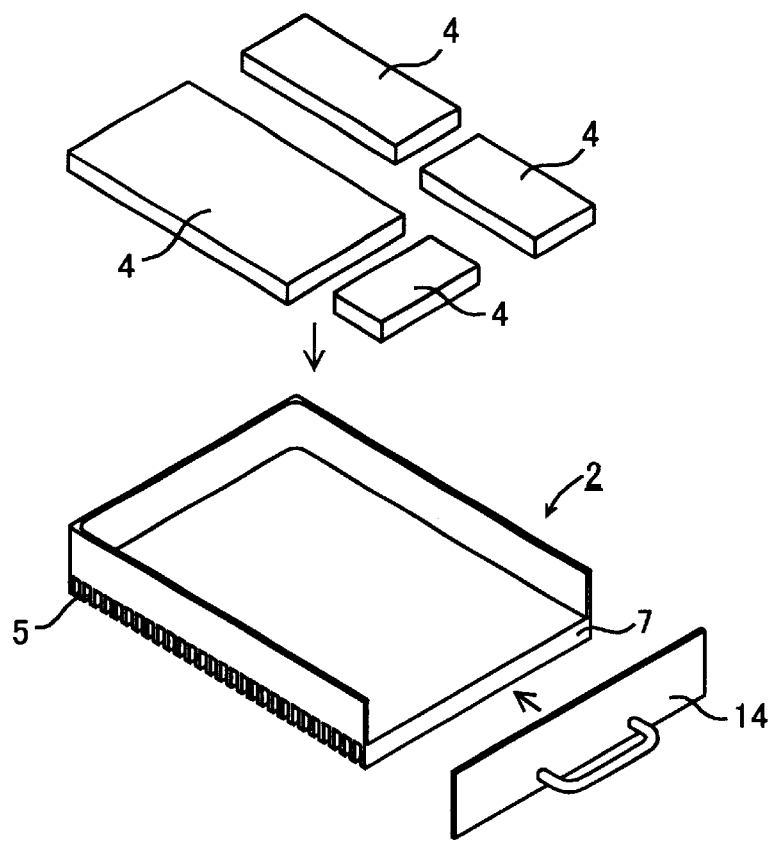
FIG. 4 is exploded, perspective views of the electronic equipment.
Figure 4B:
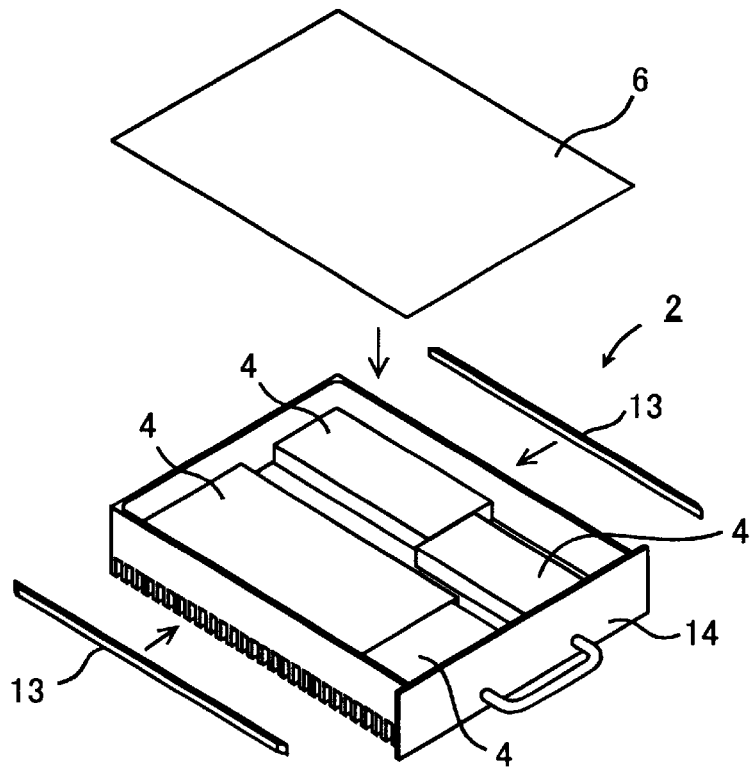
Figure 5A:
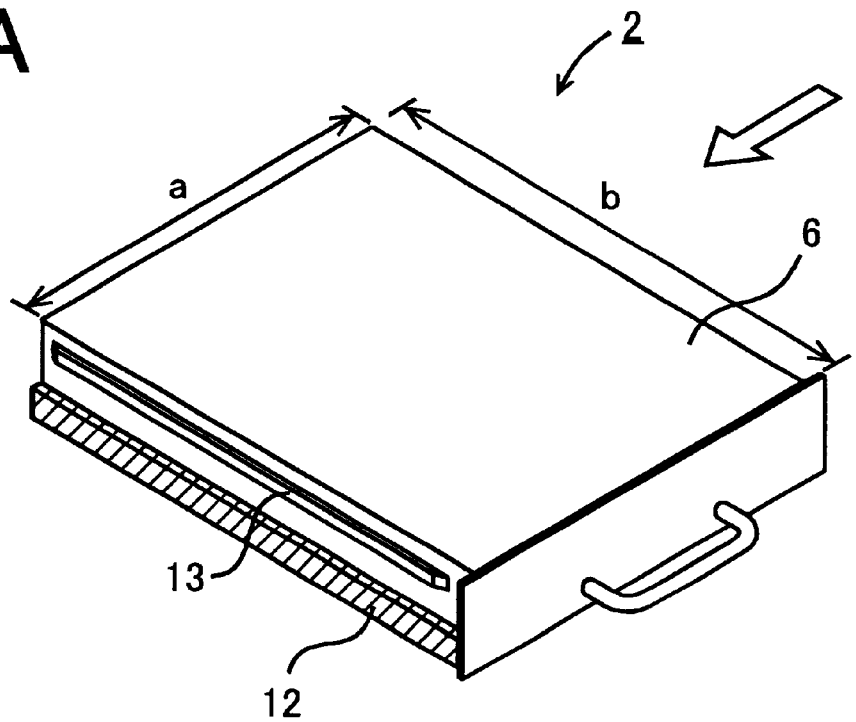
FIG. 5 is perspective views showing external appearances of the electronic equipment provided with a pressure-loss adjusting plate.
Figure 5B:
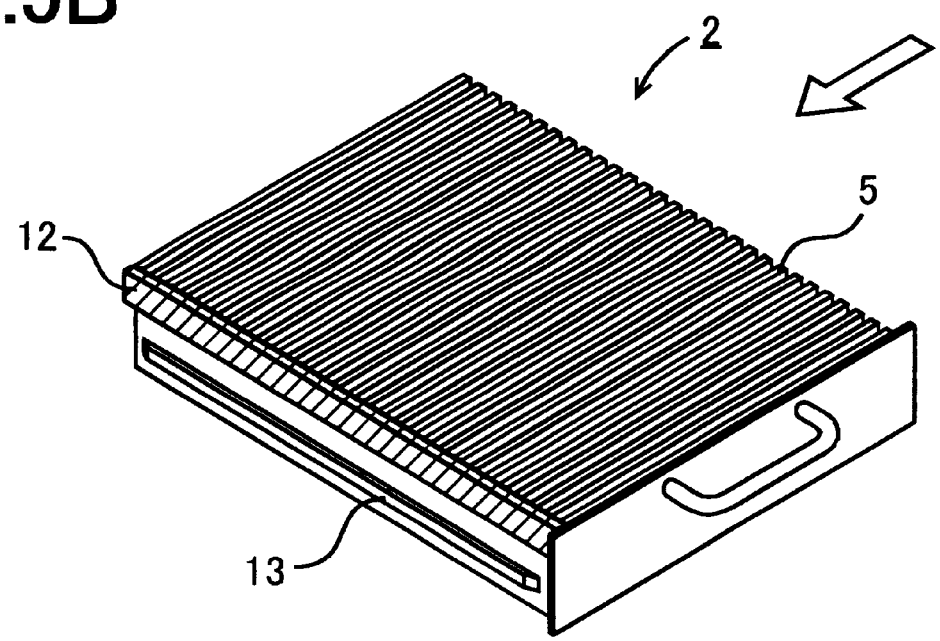

FIG. 4 is exploded, perspective views of the electronic equipment 2 shown in FIG. 3. In FIG. 4, the reference numeral 14 denotes a front panel. Although not shown in FIG. 4, the front panel 14 is generally provided with connectors, which connect to external equipments (not shown) electronic parts 4 mounted in the the electronic equipment 2. FIG. 4A shows a state, in which the electronic parts 4 are mounted on a chassis 7, with which the fins 5 are formed integral and to which the front panel 14 is mounted, and FIG. 4B shows a state, in which the cover 6 and the rails 13 are mounted to the chassis. FIG. 5 is perspective views showing external appearances of the electronic equipment 2 provided with the pressure-loss adjusting plate 12. In FIG. 5, an arrow indicates a direction, along which an air supplied from a fan 3 flows into the air paths. The electronic equipment 2 shown in FIG. 5 is formed with the pressure-loss adjusting plate 12, which is provided in a manner to cover the side end surface downstream of the fin 5.

Figure 6:
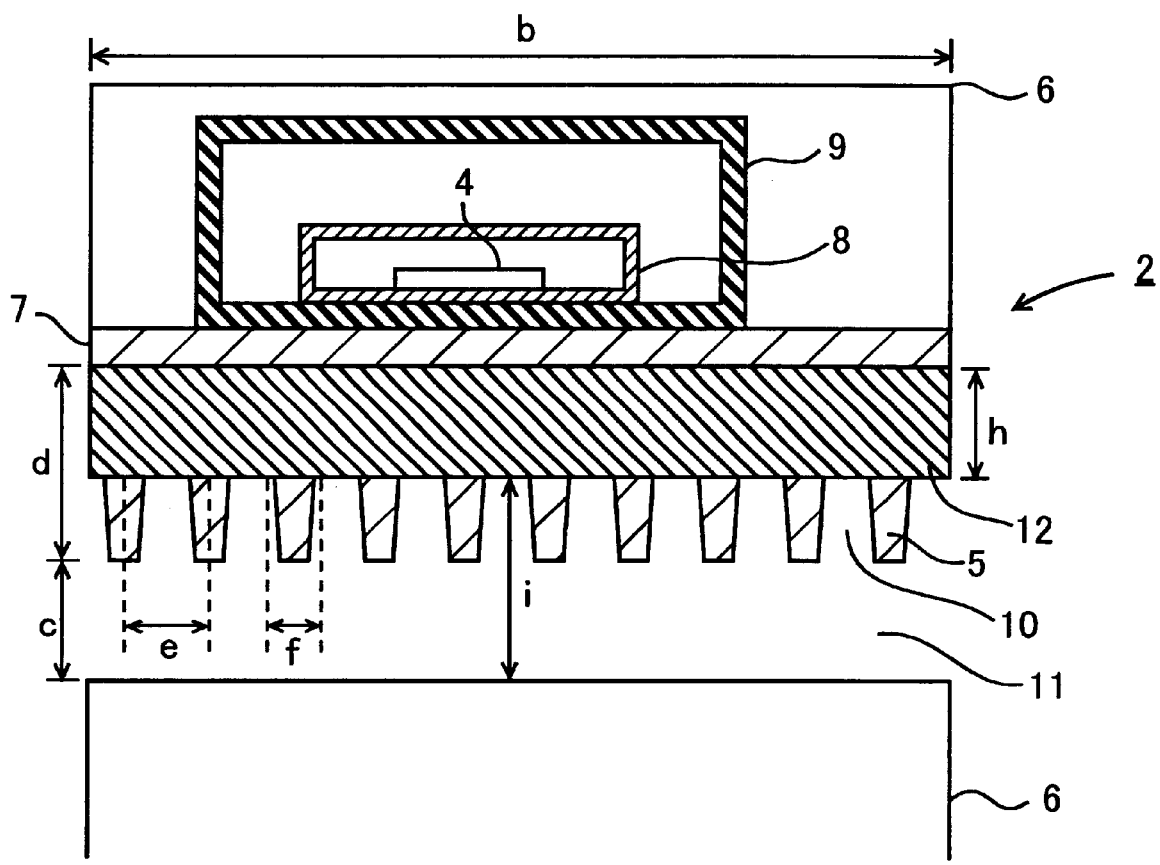
FIG. 6 is a cross sectional view of the electronic equipment provided with the pressure-loss adjusting plate.

FIG. 6 is a cross sectional view taken along the line A–A' of the electronic equipment and clearly showing the pressure-loss adjusting plate 12 characteristic of the invention. The pressure-loss adjusting plate 12 shown in FIG. 6 is a rectangular-shaped plate member provided to cover the side end surfaces of the fins 5 on a downstream side of the fins 5. The pressure-loss adjusting plate 12 shown in FIG. 6 is sized such that its height h is about a half of a height d of the fins and its width is equal to a total width of the electronic equipment 2. The pressure-loss adjusting plate 12 can be formed from metals, plastics and so on.

The pressure-loss adjusting plate 12 is joined to the fins 5 and the chassis 7 with an alloy of low melting point as an adhesive. Concretely, it is common in joining of copper members to melt a silver alloy and use the same as an adhesive. Also, the pressure-loss adjusting plate 12 may be formed integral with the heat sink (the fins 5 and the chassis 7) by means of die casting. Die casting is a method of molding by flowing a melted metal into a casting mold. Also, the pressure-loss adjusting plate 12 may be screwed on the fins 5 and the chassis 7. A plate (punched metal) formed with a number of holes and a metallic mesh may be used for the pressure-loss adjusting plate 12.

An explanation will be given below to a radiating action of the electronic equipment 2 mainly with reference to FIG. 6. The electronic parts 4 mounted in the pressure-loss adjusting plate 12 generate heat in the course of action. Heat generated by the electronic parts 4 results in temperature of 100 degrees to as high as 140° C. or higher. Heat generated by the electronic parts 4 is transmitted to a package 8, an inner casing 9, the chassis 7 and the fins 5 shown in FIG. 6 while temperature gradually decreases. Concretely, when an amount of heat generated by the electronic parts 4 amounts to 50 W and entails temperature of 120° C., the package 8 is at about 80° C., the inner casing 9 is at about 77° C., the chassis 7 is at about 70° C., and the fins 5 is at about 68° C.

The fan 3 supplies an air into the rack 1 to thereby create a flow of wind passing through fin-inbetween wind paths 10 and bypass wind paths 11. A rate of a fin-inbetween air volume being an amount of air flowing into the fin-inbetween wind paths 10 to a bypass air volume being an amount of air flowing into the bypass wind paths 11 is determined by balancing of pressure loss (wind-path resistance) between the fin-inbetween wind paths 10 and the bypass wind paths 11. Heat generated by the electronic parts 4 mounted in the electronic equipment 2 is transmitted to the fins 5 to be discharged from the fins 5 by an air flowing the fin-inbetween wind paths. Generally, even when a total air volume is constant, heat can be efficiently radiated from the electronic equipment 2 by increasing an air volume passing between the fins.

Like the electronic apparatus shown in FIGS. 1 and 2, in the case where a plurality of electronic equipments 2 are contained within the rack 1, wind paths are defined between the respective electronic equipments. The wind paths between the respective electronic equipments 2 comprise the fin-inbetween wind paths 10 and the bypass wind paths 11.

For example, with an arrangement, in which four electronic equipments 2 are contained within the rack 1 as in the electronic apparatus shown in FIG. 1, there are provided four wind paths 18a–18d. Also, with an arrangement, in which six electronic equipments 2 are contained within the rack 1 as in the electronic apparatus shown in FIG. 2, there are provided six wind paths. It has been revealed that an air volume flowing into these wind paths fluctuates around 20% at the maximum due to such factors as pressure loss (wind-path resistance) in the respective wind paths, wind speed distribution in the rack 1, locations where the electronic equipments 2 are mounted, and the like.

Let assume that air volumes flowing into, for example, the wind paths 18a, 18c among the wind paths 18a–18d. It is contemplated in the invention that the pressure-loss adjusting plates 12 are provided on those fins 5, which face wind paths of large inflowing air volumes, for example, the wind paths 18a, 18c, to thereby increase pressure loss (wind-path resistance) in the fin-inbetween wind paths 10 defining the wind paths 18a, 18c and to decrease air volumes flowing into the wind paths 18a, 18c. It is found that owing to the provision of the pressure-loss adjusting plates 12, a height on upstream sides of the wind paths is (c+d) while a height on downstream sides of the wind paths is i to be smaller than that on the upstream sides of the wind paths. If a width b of the electronic equipments 2 against a direction of air flow is constant, the pressure-loss adjusting plates 12 are provided on the downstream side of the fins 5 to present difference in height between an upstream side and a downstream side, thereby varying cross sectional areas of the wind paths between the upstream side and the downstream side. In this manner, the pressure-loss adjusting plates 12 sharply change cross sectional areas of the wind paths between the upstream side and the downstream side to increase the pressure-loss of the wind paths.

In this manner, the provision of the pressure-loss adjusting plates 12 on the downstream side of the fins 5 can reduce air volumes flowing into the wind paths 18a, 18c shown in FIG. 1 and increase air volumes flowing into the wind paths 18b, 18d. Accordingly, air volumes flowing into the respective wind paths are made even. Further, there can be enumerated an advantage that a ratio of air volumes in the fin-inbetween wind paths and the bypass wind paths does not change by virtue of the pressure-loss adjusting plates 12 being used to adjust pressure loss in the wind paths. In effect, there is not caused such a problem that an air flowing into the fin-inbetween wind paths passes through the bypass wind paths to lead to reduction in an air volume between the fins and in heat radiation efficiency as in the case where pitches between the fins are adjusted to correct scatter in air volume in the respective wind paths.

Pressure loss (wind-path resistance) in a wind path signifies a difference in pressure between upstream-most and downstream-most positions in a wind path under discussion. Pressure loss characteristics (wind-path resistance characteristics) can be represented by the following formula, pressure difference (pressure loss, wind-path resistance)=K×(air volume)$^m$. Here, k is a proportional coefficient and called a pressure loss coefficient. Also, m ($1 \leq m \leq 2$) is a multiplier. When "pressure loss (wind-path resistance) is great" holds, pressure losses with the same air volume are usually compared and discussed. When m is the same, comparison is made with respect to K. Unit for pressure loss is Pa, and unit for air volume is m$^3$/s. The relationship between pressure loss and air volume can be explained following the example of the relationship between electric potential difference and electric current. For example, when the fin pitches are decreased, pressure losses in the fin-inbetween wind paths increase and air volumes between the fins decrease resulting in an increase in bypass air volumes. Pressure losses adjusted by decreasing the fin pitches correspond to parallel resistances. In effect, in the case where one of the resistances (pressure losses in the bypass wind paths) is invariable even when the other of the resistances (pressure losses in the fin-inbetween wind paths) is increased, an air passing through the fin-inbetween wind paths goes through the bypass wind paths, so that an air volume passing through a certain wind path is invariable. Accordingly, there cannot be obtained an effect that amounts of an air flowing into a plurality of wind paths are made uniform.

For example, in the case where a fin pitch e is 5 mm, a fin height d is 20 mm, a height c of the bypass wind paths 3 mm, a ratio of pressure loss coefficients K is around 2:3. Also, in the case where the fin pitch is narrowed to increase pressure loss due to friction, the pressure loss value m is proportional to wind speed to become m=1. At this time, the resultant resistance coefficient K becomes $1/(\frac{1}{2}+\frac{1}{3})=1.2$ in the same manner as in electric circuits. Even when the fin pitch is narrowed to double 2, the total air volume is increased to 1.7, which corresponds to an increase of about 40%. At this time, the rotating speed of the fan is regulated so that pressure loss becomes invariable, and then the total air volume is reduced to 70% and an air volume flowing over the fins is reduced to 50% of the initial air volume. That is, when the air volume is adjusted, for example, 30%, an air volume flowing between the fins is reduced 50%, so that the heat radiation efficiency of the electronic equipments decreases.

Meanwhile, pressure loss adjusted by providing the pressure-loss adjusting plates 12 on the downstream sides of the fins corresponds to series resistance in electric circuits. That is, since the provision of the pressure-loss adjusting plates 12 causes an increase both in pressure loss in the fin-inbetween wind paths and pressure loss in the bypass wind paths, an air volume passing through a certain wind path decreases. Since in proportion to a decrease in amount of an air flowing into the wind paths provided with the pressure-loss adjusting plates 12, an amount of an air flowing into the other wind paths increases, scatter in an amount of an air flowing into the respective wind paths is suppressed. The profile drag (resistance caused when the wind paths vary sharply in cross section) provided by the pressure-loss adjusting plates 12 presents m=2 (the pressure loss value due to friction is in proportion to the wind speed to present m=1). When pressure-loss adjusting plates, for which pressure loss is 0.1 (that is, the pressure loss coefficient is 0.1) at air volume 1, are provided in downstream sides of those wind paths, of which pressure loss coefficient is the above-mentioned fin-inbetween ones: the bypass ones=2:3, the total pressure loss becomes 1.3. At this time, pressure loss is made 1.2 by regulating the rotating speed of the fan, and then an air volume of around V=0.9 is obtained from solving of $1.2 \times V + 0.1 \times V^2 = 1.2$. Air volume between the fins is reduced 10% to become around 0.54.

As described above, the electronic apparatus according to the invention is constructed such that the pressure-loss adjusting plates 12 are provided on the fins 5 facing those wind paths of large inflowing air volume among the wind paths formed between the respective electronic equipments 2 received in the rack 1. That is, the pressure-loss adjusting plates 12 are provided in a manner to cover the downstream side end surfaces of the fins, whereby pressure loss (wind-path resistance) of the wind paths provided with the pressure-loss adjusting plates 12 is increased and an air volume flowing into such wind paths is reduced. Conversely, since an air volume flowing into the other wind paths not provided with the pressure-loss adjusting plates 12 increases, the respective wind paths are relatively made uniform in inflowing air volume. Accordingly, the electronic apparatus according to the invention can uniformly discharge heat from the electronic equipments 2 received in the rack 1, and so does not cause a problem that any one of the electronic equipments abnormally generates heat. Accordingly, there is obtained an effect that the electronic equipments are enhanced in reliability.

Also, with the electronic apparatus according to the invention, the wind paths are not regulated in pressure loss by narrowing the fin pitch but the pressure-loss adjusting plates 12 are provided to vary resistance caused when the wind paths are sharply changed in cross sectional area, thereby regulating the wind paths in pressure loss, so that the fin-inbetween wind paths and the bypass wind paths are maintained constant in balancing of wind-path resistance. That is, since a ratio of air volumes in the fin-inbetween wind paths and the bypass wind paths does not change, a problem is inhibited from being caused that an air flowing into the fin-inbetween wind paths passes through the bypass wind paths to cause reduction in air volume between the fins, thus leading to a decrease in heat radiation efficiency.

Figure 7:
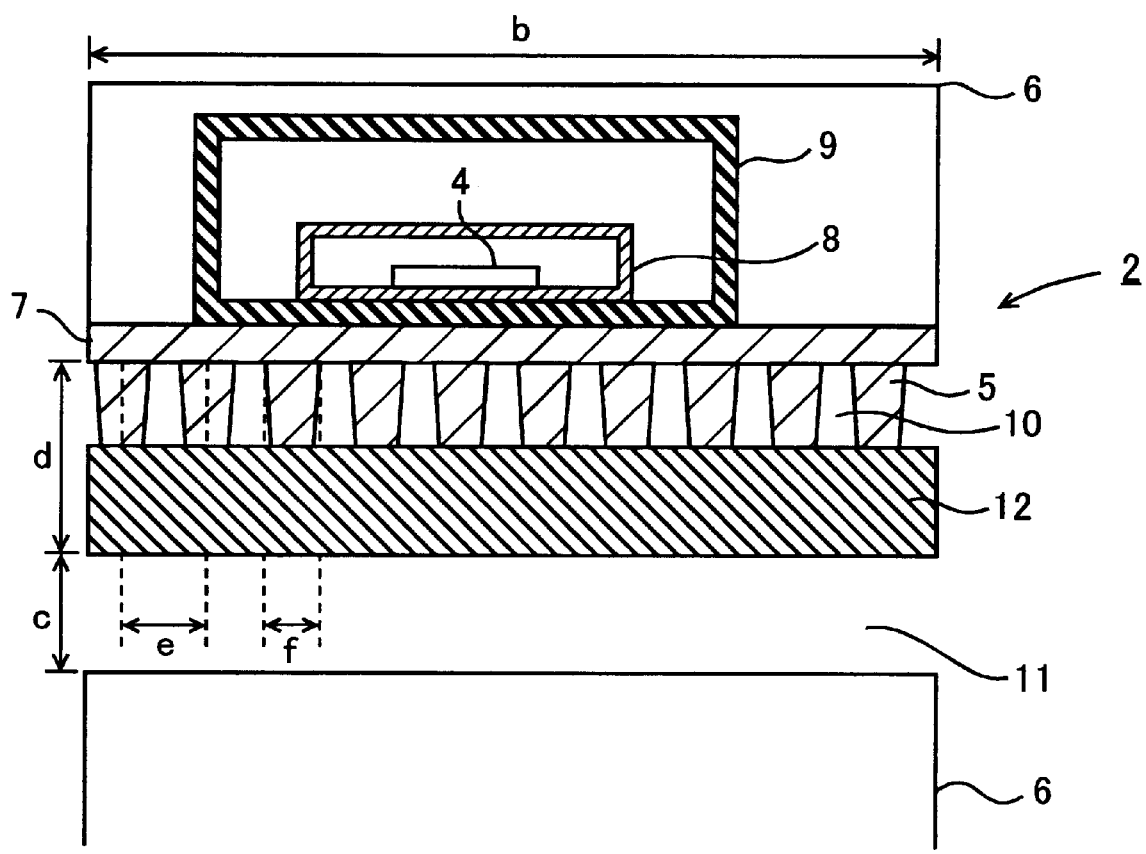
FIG. 7 is a cross sectional view of the electronic equipment provided with the pressure-loss adjusting plate.

In addition, while the above-mentioned electronic apparatus involves provision of the pressure-loss adjusting plates 12 on a side of the chassis 7 as shown in FIG. 6, the pressure-loss adjusting plates may be provided on a side of tip ends of the fins 5 as shown in FIG. 7. Also, the pressure-loss adjusting plates 12 shown in FIG. 6 are formed from members having a width equal to the entire width of the wind paths but members having a width equal to the entire width of the wind paths need not necessarily be used. Further, it does not matter if a height h of the pressure-loss adjusting plates corresponds to a height d of the fins. Mount positions of and size of the pressure-loss adjusting plates suffice to be determined in relation to pressure loss (wind-path resistance) of the wind paths.

The above-mentioned electronic apparatus according to the invention comprises an electronic equipment or equipments having a plurality of fins arranged to extend from an upstream side, where an air inflows, to a downstream side, a chassis permitting heat of heat generating electronic parts to be radiated through the fins, and a cover which covers the heat generating electronic parts; a rack containing therein a plurality of the electronic equipments, on which the fins of and the cover of adjacent electronic equipments face each other with a predetermined distance therebetween, the rack being formed with a plurality of wind paths, which are composed of fin-inbetween wind paths being passages of an air flowing between the fins, and bypass wind paths being passages of an air flowing between the fins of and the cover of adjacent electronic equipments; a fan for supplying an air into the rack and creating air flows passing through a plurality of wind paths formed within the rack; and pressure-loss adjusting members mounted on downstream sides of predetermined wind paths, in which an amount of inflowing air is relatively much, among the plurality of wind paths, to make a downstream-side cross sectional area of the predetermined wind paths smaller than a upstream-side cross sectional area thereof, thereby increasing pressure loss of the predetermined wind paths. Therefore, the electronic equipments contained within the rack can be made to evenly radiate heat, and so there is provided an effect of suppressing a problem that any one of the electronic equipments would overheat.

Also, the above-mentioned electronic equipment, according to the invention, is arranged in plural within a predetermined housing to be spaced a predetermined distance from one another, each mounting thereon heat generating electronic parts generating heat, which is radiated by an air supplied into the housing, and the electronic equipment comprises a chassis, on which a plurality of fins are formed on an opposite side to a surface, on which the heat generating electronic parts are mounted, to extend from an upstream side, where an air inflows, to a downstream side, the chassis permitting an air flowing between the fins to radiate heat from the heat generating electronic parts, and a pressure-loss adjusting member formed to cover downstream-side end surfaces of the fins such that a wind path composed of fin-inbetween wind paths, which are passages of an air flowing between the fins, and a bypass wind path, which is a passage of an air flowing between adjacent electronic equipments, has a downstream-side cross sectional area larger than a upstream-side cross sectional area thereof. Therefore, it is possible to reduce amounts of an air flowing into predetermined wind paths and to increase amounts of an air flowing into other wind paths.

What is claimed is:

1. An electronic apparatus comprising:
    a rack configured to contain an adjacent set of electronic devices, wherein
        each member of said adjacent set includes a heat generating component encased in a chassis having a cover and a plurality of fins arranged on a chassis fin-mount surface opposite a chassis component-mount surface and extending from a chassis upstream air intake to a chassis downstream air exhaust,
        a plurality of fins and a cover of a first member of said adjacent set is arranged to face a plurality of fins and a cover of another member of said adjacent set and separated by a predetermined distance, and
        said rack contains a plurality of wind paths including a between-the-fins wind path and an equipment-to-adjacent-equipment bypass wind path;
    a fan configured to supply air into the rack so as to create air flows through said plurality of wind paths; and
    at least one pressure-loss adjusting member mounted on a downstream side of at least one predetermined wind path and configured such that a downstream-side cross sectional area of said at least one predetermined wind path is smaller than an upstream-side cross sectional area of said at least one predetermined wind path so as to increase a pressure loss across said at least one predetermined wind path.

2. The electronic apparatus according to claim 1, wherein
    the at least one pressure-loss adjusting member is configured to cover a downstream-side end surface of a plurality of fins of one of said adjacent set so as to increase said pressure loss across the predetermined wind path.

3. The electronic apparatus according to claim 2, wherein
    the at least one pressure-loss adjusting member is a plate-shaped member configured to extend perpendicular to an air flow direction and to be mounted on a downstream end surface of said plurality of fins of one of said adjacent set so as to cover an entire downstream-side width of the predetermined wind path.

4. A plurality of electronic devices separated by a predetermined spacing within a housing, each of said plurality of electronic devices comprising:
    an air-cooled heat generating electronic part housed within a chassis having a plurality of fins formed on a chassis fin side opposite to a chassis surface on which the air-cooled heat generating electronic part is mounted, said plurality of fins configured to extend from a chassis upstream air intake to a chassis downstream air exhaust; and
    a pressure-loss adjusting member configured to cover a downstream end surface of each of the plurality of fins such that a downstream-side cross sectional area of a predetermined wind path is smaller than an upstream-side cross sectional area of the predetermined wind path so as to increase a pressure loss of said predetermined wind path.

* * * * *